(12) United States Patent
Lin

(10) Patent No.: US 8,431,424 B2
(45) Date of Patent: Apr. 30, 2013

(54) LIQUID CRYSTAL DISPLAY PANEL AND FABRICATION METHOD THEREOF

(75) Inventor: Yao-Nan Lin, Miao-Li County (TW)

(73) Assignee: Chimei Innolux Corporation, Miao-Li County (TW)

(*) Notice: Subject to any disclaimer, the term of this patent is extended or adjusted under 35 U.S.C. 154(b) by 347 days.

(21) Appl. No.: 12/889,427

(22) Filed: Sep. 24, 2010

(65) Prior Publication Data

US 2011/0073855 A1    Mar. 31, 2011

(51) Int. Cl.
*H01L 21/00* (2006.01)

(52) U.S. Cl.
USPC .............................. 438/28; 438/30; 438/158

(58) Field of Classification Search ............ 438/28, 438/30, 158
See application file for complete search history.

(56) References Cited

U.S. PATENT DOCUMENTS

| | | | |
|---|---|---|---|
| 6,362,031 B1* | 3/2002 | Yamaguchi et al. | 438/158 |
| 6,600,546 B1* | 7/2003 | Ahn et al. | 349/187 |
| 6,842,199 B2* | 1/2005 | Ahn et al. | 349/38 |
| 6,862,051 B2* | 3/2005 | Ahn et al. | 349/44 |
| 6,862,055 B2* | 3/2005 | Park | 349/110 |
| 6,869,833 B1* | 3/2005 | Chen | 438/158 |
| 7,279,370 B2* | 10/2007 | Lim et al. | 438/155 |
| 7,988,871 B2* | 8/2011 | Kwack et al. | 216/39 |
| 2007/0057261 A1 | 3/2007 | Jeong et al. | |
| 2009/0191653 A1* | 7/2009 | Lee | 438/29 |
| 2009/0269872 A1* | 10/2009 | Lee et al. | 438/30 |
| 2010/0182526 A1* | 7/2010 | Lee et al. | 349/43 |
| 2010/0230682 A1* | 9/2010 | Song et al. | 257/59 |
| 2010/0308324 A1* | 12/2010 | Kim et al. | 257/43 |
| 2011/0012120 A1* | 1/2011 | Oh et al. | 257/59 |
| 2011/0013130 A1* | 1/2011 | Choi et al. | 349/141 |
| 2011/0042676 A1* | 2/2011 | Ren | 257/59 |
| 2011/0073855 A1* | 3/2011 | Lin | 257/43 |
| 2011/0117697 A1 | 5/2011 | Akimoto et al. | |
| 2011/0193807 A1* | 8/2011 | Huang et al. | 345/173 |
| 2011/0220902 A1* | 9/2011 | Lee et al. | 257/59 |
| 2012/0107983 A1* | 5/2012 | Choi | 438/34 |
| 2012/0142245 A1* | 6/2012 | Kim et al. | 445/24 |
| 2012/0184060 A1* | 7/2012 | Song et al. | 438/34 |
| 2012/0211746 A1* | 8/2012 | Kim et al. | 257/43 |

FOREIGN PATENT DOCUMENTS

CN         101335304 A      12/2008

* cited by examiner

*Primary Examiner* — Laura Menz
(74) *Attorney, Agent, or Firm* — WPAT, PC; Justin King

(57) ABSTRACT

A method for manufacturing a LCD panel includes providing a substrate defining a TFT region and a pixel region; forming a transparent conductive layer and a first metal layer on the substrate in that order; forming a gate line in the TFT region, and a pixel electrode within the pixel region via a first photo-etching process; forming an insulating layer and a semiconductor layer on the substrate in that order; removing the insulating layer and the semiconductor layer from the pixel region; removing the first metal layer from the pixel region; forming a second metal layer on the substrate; forming a source electrode and a drain electrode in the TFT region via a second photo-etching process, and forming a protecting layer above the substrate.

12 Claims, 14 Drawing Sheets

LIQUID CRYSTAL DISPLAY PANEL AND FABRICATION METHOD THEREOF

BACKGROUND

1. Technical Field

The present disclosure relates to liquid crystal display (LCD) technology, and particularly to a thin film transistor LCD (TFT-LCD) panel and a method for fabricating the panel.

2. Description of Related Art

An LCD is capable of displaying a clear and sharp image through millions of pixels that make up the complete image, thus, it has been applied in various electronic devices such as mobile phones and notebook computers. The LCD generally includes an LCD panel for displaying images, and a backlight module to provide light thereto.

A typical TFT-LCD panel includes a transparent substrate, a thin film transistor (TFT) array, a pixel electrode, a plurality of gate lines, a plurality of data lines, and a color filter formed on the transparent substrate. The TFT-LCD panel further includes a liquid crystal layer sandwiched between the transparent substrate and the color filter, and a plurality of electronic components, such as capacitors, to apply a voltage to the liquid crystal layer, such that an image is viewable on a display screen of the LCD.

A typical method for fabricating the TFT-LCD panel usually requires at least five photo-etching processes. However, the five photo-etching processes are rather complicated and costly. Moreover, dust or other contaminants can jeopardize the quality of the product during each of the five photo-etching processes. Accordingly, the yield rate of the TFT-LCD panel decreases as the number of the photo-etching processes increases.

Therefore, there is room for improvement within the art.

SUMMARY

A method for manufacturing a LCD panel includes providing a substrate defining a TFT region and a pixel region, forming a transparent conductive layer and a first metal layer on the substrate in that order, forming a gate electrode in the TFT region and a pixel electrode within the pixel region via a first photo-etching process, forming an insulating layer and a semiconductor layer on the substrate in that order, removing the insulating layer and the semiconductor layer within the pixel region, removing the first metal layer within the pixel region, forming a second metal layer over or above the substrate, forming a source electrode and a drain electrode in the TFT region via a second photo-etching process, and forming a protecting layer on the substrate.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
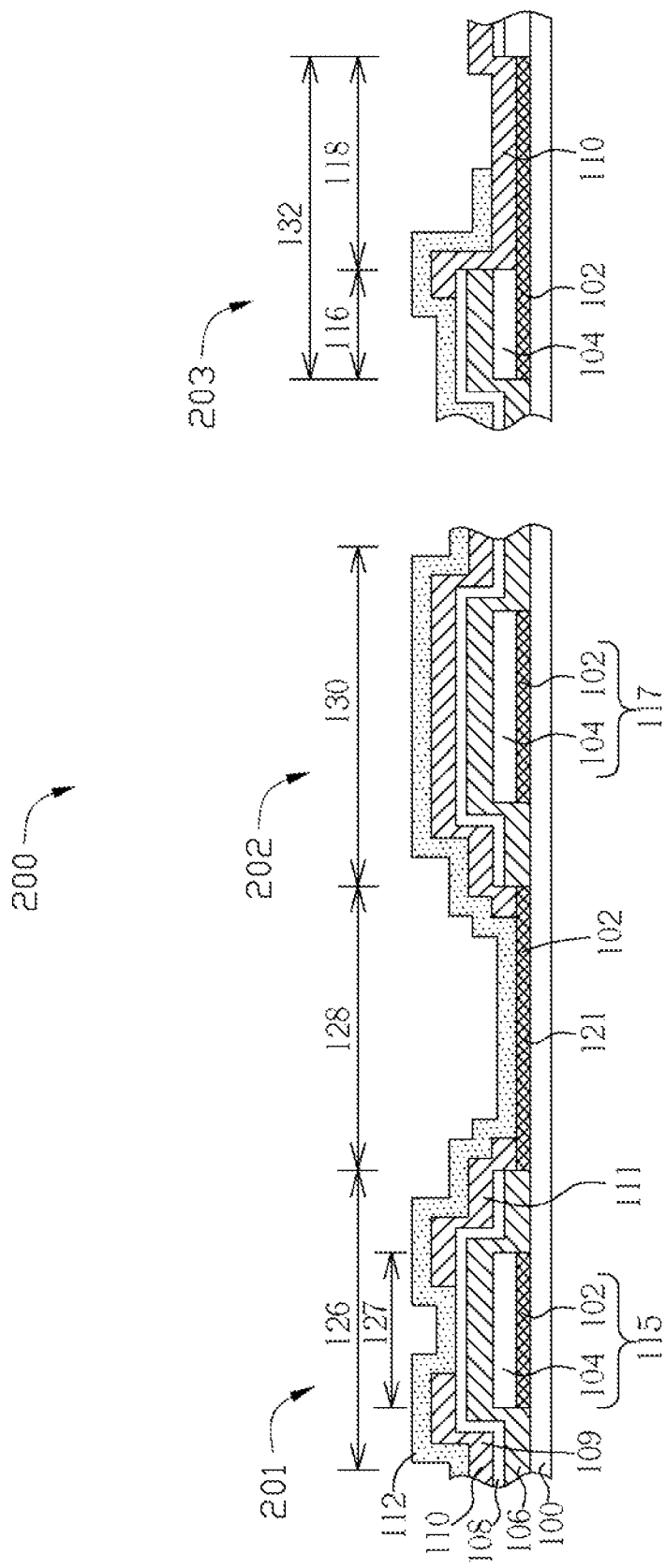
FIG. 1 is a schematic, partial, cross-section of an embodiment of a LCD panel.

Referring to FIG. 1, an embodiment of a LCD panel 200 includes a substrate 100. The substrate 100 defines at least a TFT region 126, a pixel region 128, a capacitor region 130 and a touch pad region 132. The TFT region 126 further defines a gate line region 127 in a middle portion thereof. The TFT region 126, the pixel region 128 and the capacitor region 130 cooperatively form a pixel unit. The touch pad region 132 is positioned on a margin of the substrate 100.

The LCD panel 200 further includes a TFT array 201 formed in the TFT region 126. In the illustrated embodiment, the TFT array 201 includes a gate line 115 formed on the substrate 100, an insulating layer 106 formed on the substrate 100 and the gate line 115, a semiconductor layer 108 formed on the insulating layer 106, a second metal layer 110 formed on the semiconductor layer 108, and a protecting layer 112 formed on the second metal layer 110. The semiconductor layer 108 contains IGZO (indium gallium zinc oxide). The gate line 115 includes a transparent conductive layer 102 formed in the gate line region 127 of the substrate 100, and a first metal layer 104 formed on the transparent conductive layer 102. The TFT array 201 further includes a source electrode 109 and a drain electrode 111 formed by patterning the second metal layer 110.

The LCD panel 200 further includes the transparent conductive layer 102 formed in the pixel region 128 of the substrate 100, the protecting layer 112 formed on the transparent conductive layer 102, and a liquid crystal layer (not shown) formed on the protecting layer 112. The transparent conductive layer 102 located in the pixel region 128 is electrically connected to the drain electrode 111, and forms a pixel electrode 121. A voltage can be applied between the pixel electrode 121 and the gate line 115 to drive the liquid crystal layer.

The LCD panel 200 further includes a capacitor 202 formed in the capacitor region 130 of the substrate 100. In the illustrated embodiment, the capacitor 202 is a metal-insulator-metal (MIM) capacitor, and includes a capacitor electrode 117 used as a storage capacitor. The capacitor electrode 117 further includes the transparent conductive layer 102 formed in the capacitor region 130 of the substrate 100, and the first metal layer 104 formed on a part of the transparent conductive layer 102.

The LCD panel 200 further includes a touch pad structure 203 formed in the touch pad region 132 of the substrate 100. In the illustrated embodiment, the touch pad structure 203 includes the transparent conductive layer 102 formed in the touch pad region 132 of the substrate 100, the first metal layer 104 formed on a part of the transparent conductive layer 102, and the second metal layer 110 formed on the transparent conductive layer 102 adjacent to the first metal layer 104.

Figure 2:
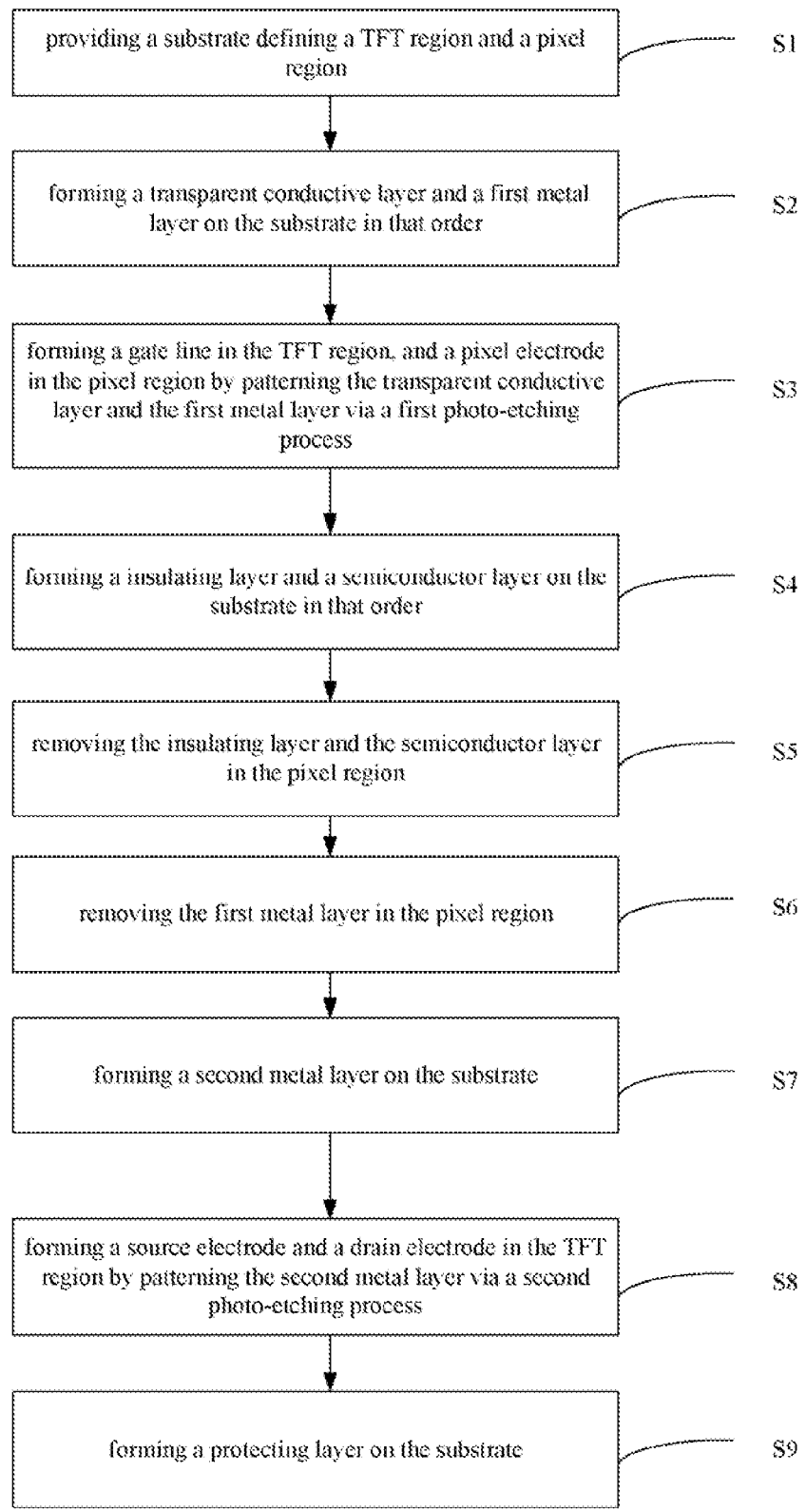
FIG. 2 is a flowchart of an embodiment of a method for fabricating the LCD panel such as, for example, that of FIG. 1.

Referring to FIG. 2, an exemplary method for fabricating an LCD panel, such as, for example, the LCD panel 200 of FIG. 1, follows. A substrate defining a TFT region and a pixel region is provided; a transparent conductive layer and a first metal layer are formed on the substrate; a gate line is formed in the TFT region, and a pixel electrode is formed in the pixel region by patterning the transparent conductive layer and the first metal layer via a first photo-etching process; an insulating layer and a semiconductor layer are formed on the substrate in that order; the insulating layer and the semiconductor layer are removed from the pixel region; the first metal layer is removed from the pixel region; a second metal layer is formed over or above the substrate; a source electrode and a drain electrode are formed in the TFT region via a second photo-etching process; and a protecting layer is formed on the substrate.

Figure 3:
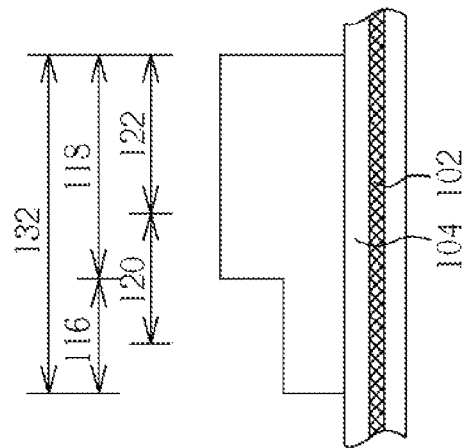
FIG. 3 through FIG. 14 are a plurality of schematic cross-sections of at least a part of an LCD panel, relating to at least one step of the method of FIG. 2, respectively.
Figure 3:
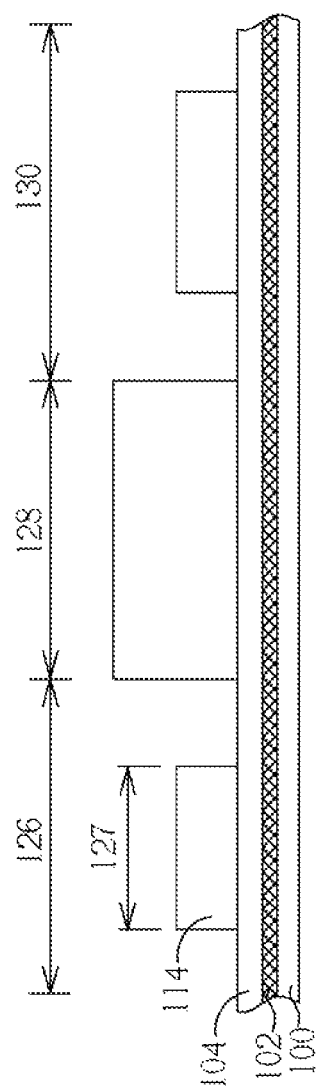

In step S1, referring also to FIG. 3, the substrate 100 is provided. The substrate 100 may be a transparent substrate such as a glass substrate. The TFT region 126, the pixel region 128, the capacitor region 130 and the touch pad region 132 are defined on the substrate 100. The TFT region 126 defines a gate line region 127. The touch pad region 132 defines a first region 116, a second region 118, a third region 120, and a fourth region 122. The third region 120 includes a part of the first region 116 and a part of the second region 118. The fourth region 122, which will become an exposure region for the touch pad structure 203, includes the remainder of the second region 118.

In step S2, referring to FIG. 3 again, the transparent conductive layer 102 and the first metal layer 104 are deposited on the substrate 100 in that order. The transparent conductive layer 102 may be ITO (Indium-Tin Oxide), IZO (Indium-Zinc Oxide), or other transparent conductive material. The first metal layer 104 may be aluminum, molybdenum, chromium, tungsten, copper, or alloy thereof.

Figure 4:
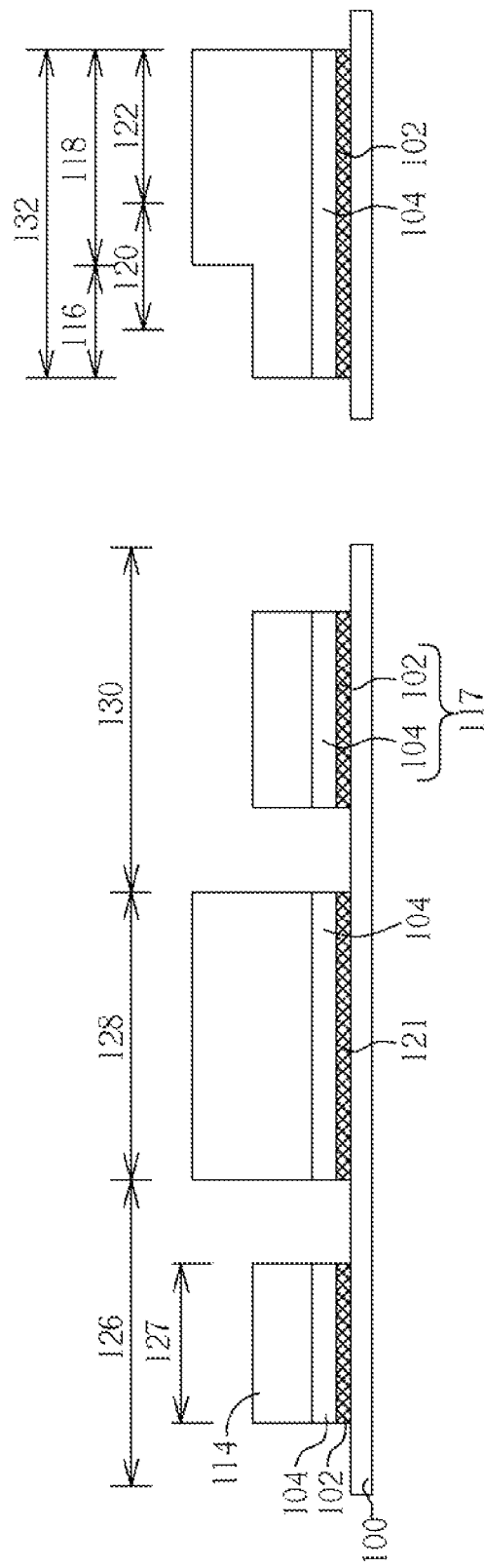
Figure 5:
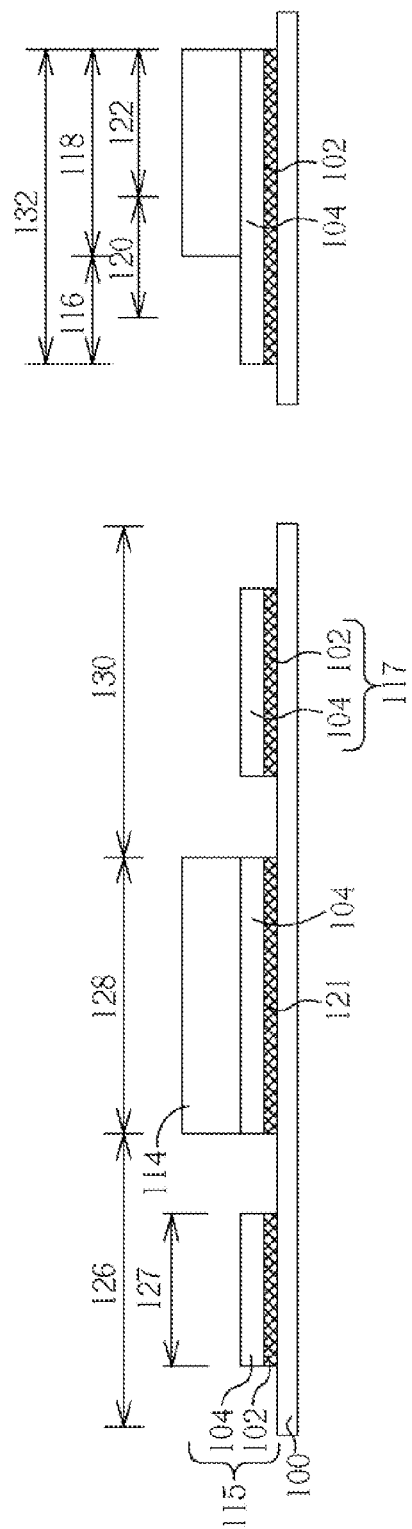

In step S3, referring to FIGS. 3 through 5, the gate line 115 is formed in the TFT region 126, and a pixel electrode 121 is formed in the pixel region 128 via a first photo-etching process.

The first photo-etching process includes, referring to FIG. 3 again, a first photo-resist layer (not shown) formed on the first metal layer 104; a plurality of first photo-resist patterns 114 of different thicknesses are formed via the first photo-etching process using a first photo mask (not shown). The first photo mask may be a gray tone mask or a half tone mask. In the illustrated embodiment, a thickness of the first photo-resist patterns 114 located in the pixel region 128 and the second region 118 exceeds that of the first photo-resist patterns 114 located in the gate line region 127, the capacitor region 130, and the first region 116. The first photo-resist layer located in other regions is completely removed by the first photo-etching process. Referring to FIG. 4, the first metal layer 104 and the transparent conductive layer 102 not covered by the first photo-resist patterns 114 are removed via a first etching process. Referring to FIG. 5, the first photo-resist patterns 114 located in the gate line region 127, the capacitor region 130, and the first region 116 are removed via a first ashing process. Thus, the gate line 115 is formed by the transparent conductive layer 102 and the first metal layer 104 located at the gate line region 127, and the capacitor electrode 117 is formed by the transparent conductive layer 102 and the first metal layer 104 located at the capacitor region 130. The first photo-resist patterns 114 located at the pixel region 128 and at the second region 118 of the touch pad region 132 are preserved because of their greater thickness.

Figure 6:
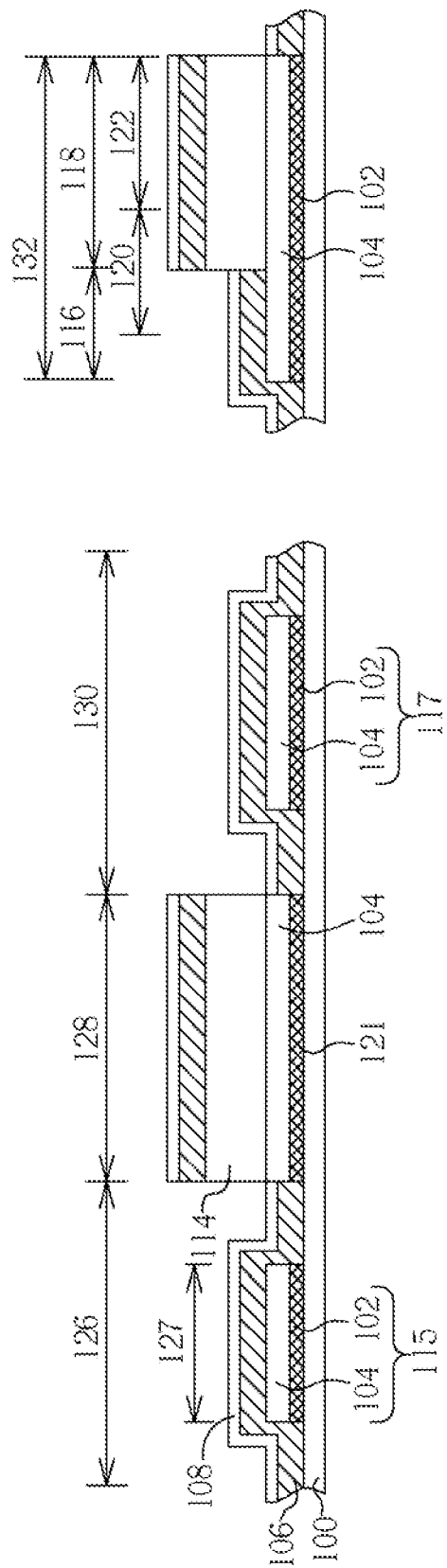

In step S4, referring to FIG. 6, the insulating layer 106 and the semiconductor layer 108 are deposited on the substrate 100 in that order. The deposition is performed at room temperature or lower than the room temperature, because the first photo-resist patterns 114 located at the pixel region 128 and at the second region 118 may decompose at a higher temperature relative to the room temperature. In the illustrated embodiment, the semiconductor layer 108 is IGZO (indium gallium zinc oxide), and the deposition is conducted at room temperature incorporating a gas including argon and oxygen. The oxygen is about 5 to 10 percent volume of the gas. The insulating layer 106 may be a single insulating layer or a composite insulating layer. The insulating layer 106 may be SiOx, SiNy, or SiON.

Figure 7:
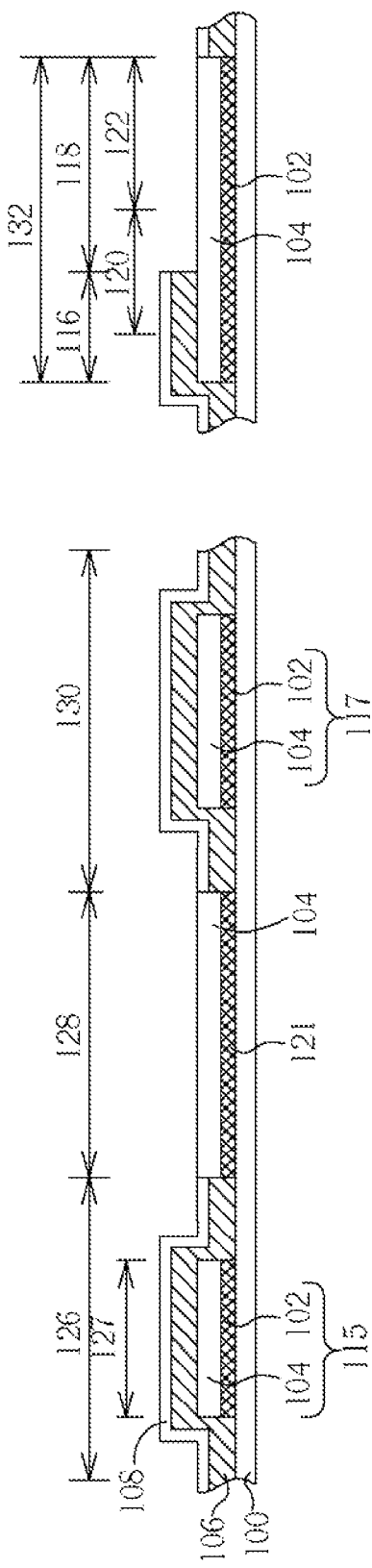

In step S5, referring to FIG. 7, the first photo-resist patterns 114 are removed via a first lift-off process. In the illustrated embodiment, a solution is used in the first lift-off process to dissolve and remove the first photo-resist patterns 114 located in the pixel region 128 and in the second region 118, thus the insulating layer 106 and the semiconductor layer 108 deposited on the first photo-resist patterns 114 are also removed.

Figure 8:
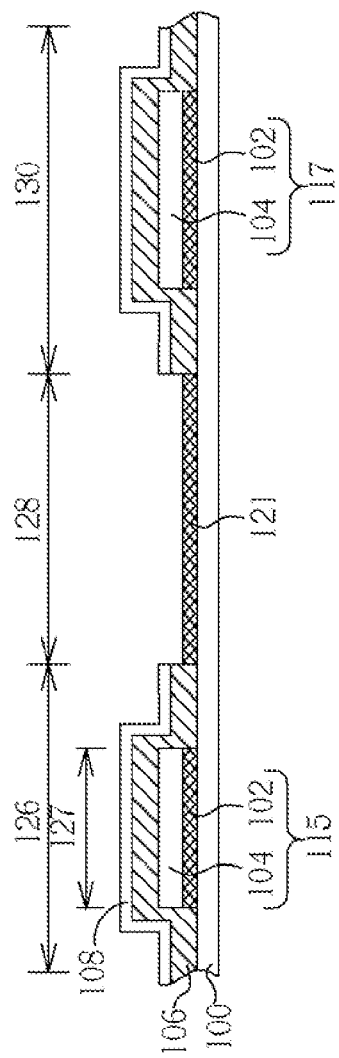
Figure 8:
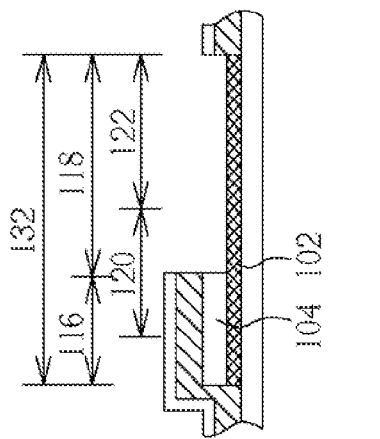

In step S6, referring to FIG. 8, the first metal layer 104 located at the pixel region 128 and at the second region 118 of the touch pad region 132 is removed. The pixel electrode 121 is thus formed by the patterned transparent conductive layer 102.

Figure 9:
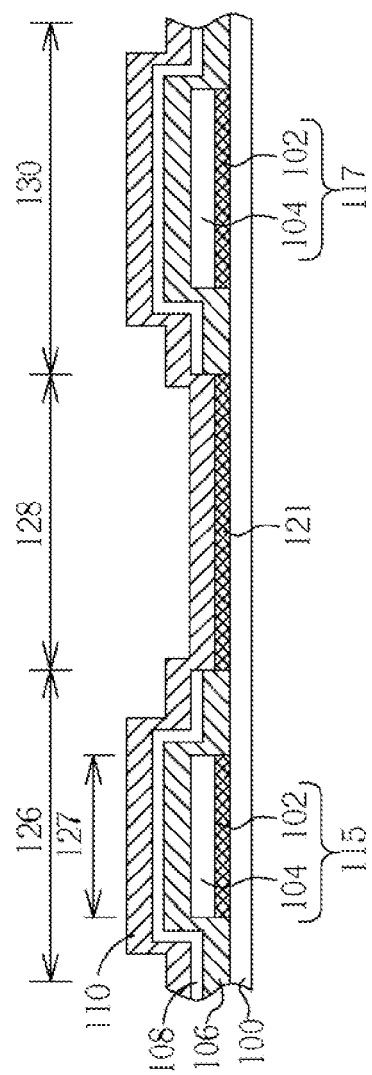

In step S7, referring to FIG. 9, the second metal layer 110 is deposited over or above the substrate 100.

Figure 10:
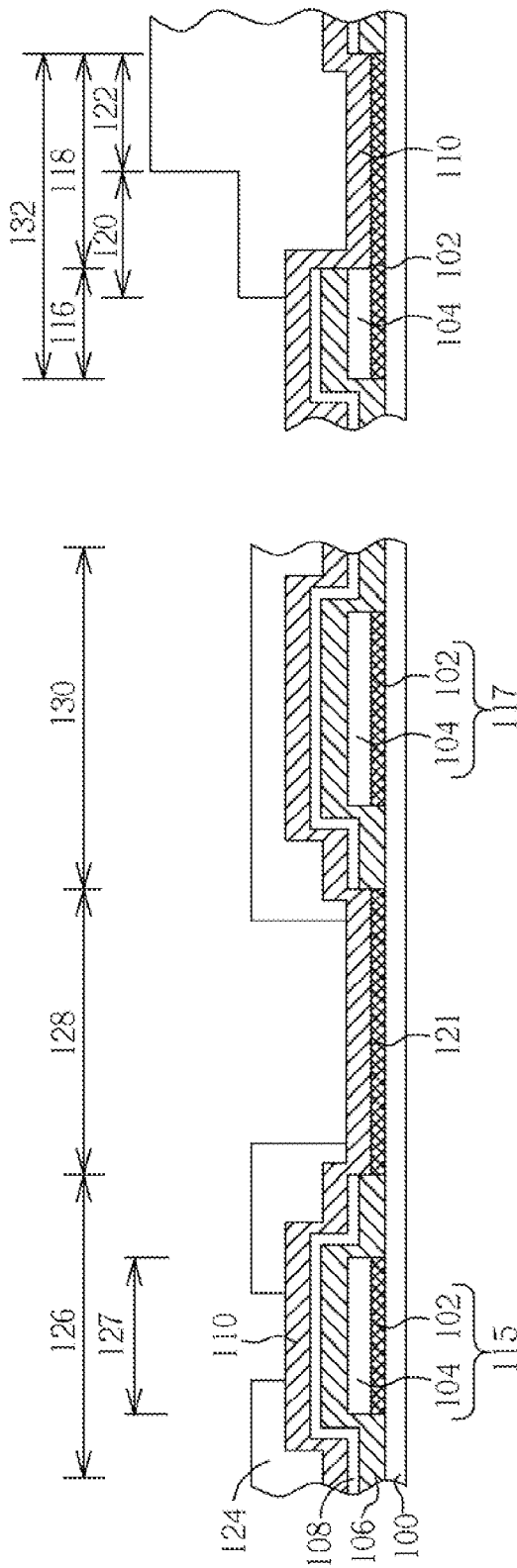
Figure 11:
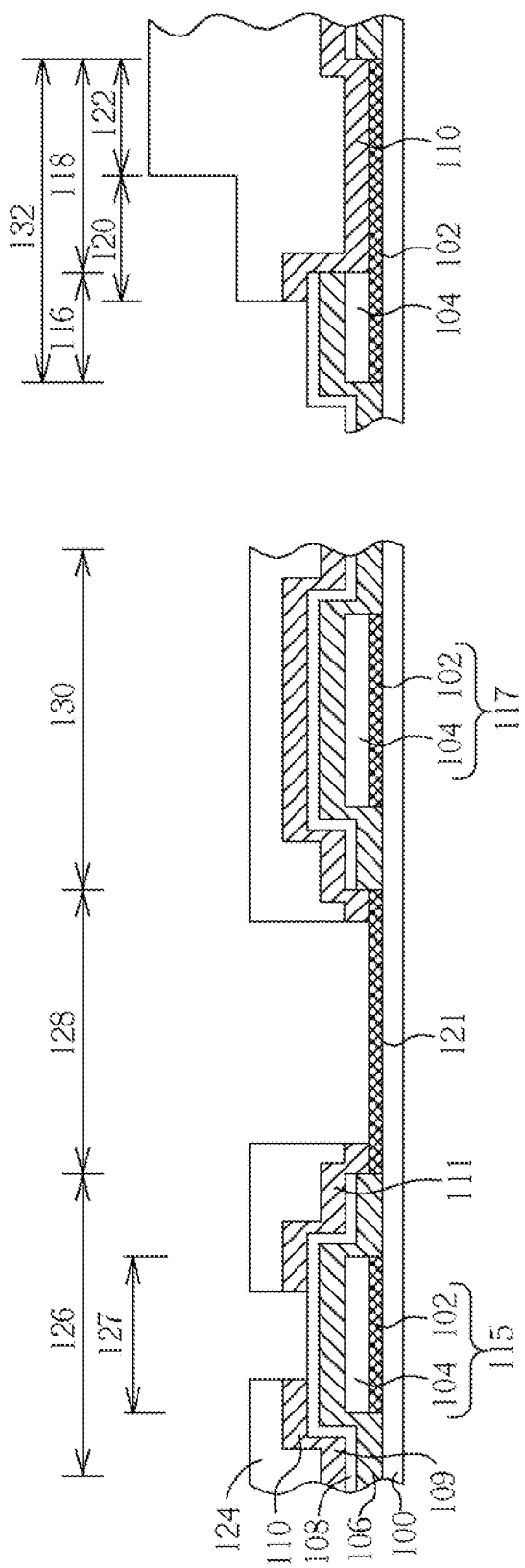
Figure 12:
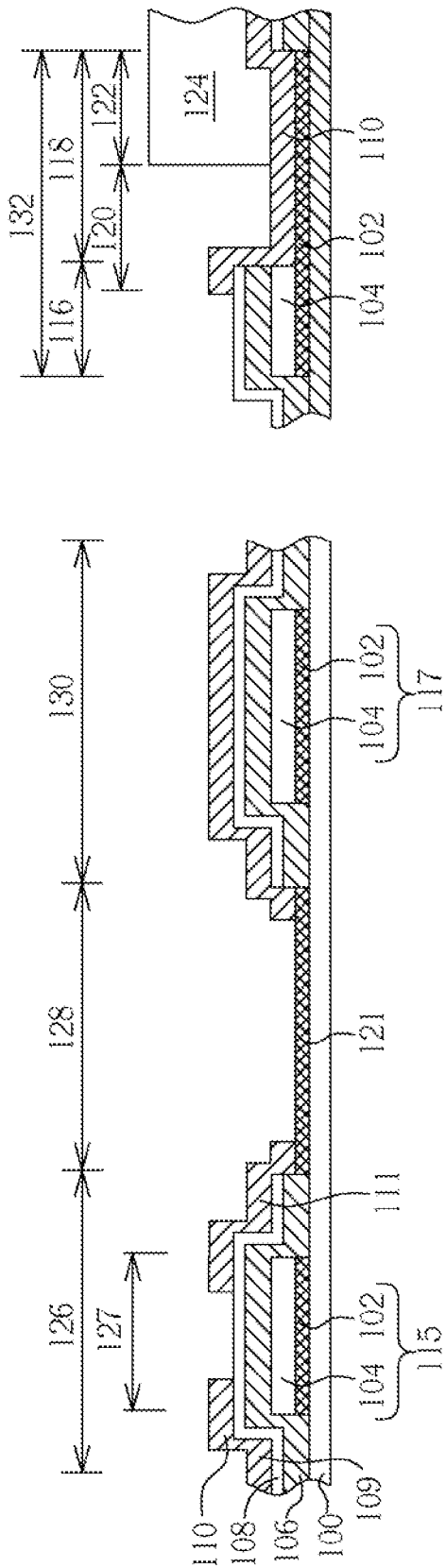

In step S8, referring to FIG. 10 through 12, the source electrode 109 and the drain electrode 111 are formed in the TFT region via a second photo-etching process.

The second photo-etching process includes, referring to FIG. 10, a second photo-resist layer (not shown) formed on the second metal layer 110, and a plurality of second photo-resist patterns 124 of different thickness formed via the second photo-etching process using a second photo mask (not shown). The second photo mask may be a gray tone mask or a halftone mask. In the illustrated embodiment, a thickness of the second photo-resist patterns 124 located at the fourth region 122 exceeds the thickness of the second photo-resist patterns 124 located at a part of the TFT region 126 corresponding to the source electrode 109 and the drain electrode 111, the capacitor region 130, and the third region 120, respectively. The second photo-resist layer located at other regions is completely removed by the second photo-etching. Referring to FIG. 11, the second metal layer 110 not covered by the second photo-resist patterns 124 is removed via a second etching process, and the source electrode 109 and the drain electrode 111 are thus formed from the second metal layer 110 located at the TFT region 126. Finally, referring to FIG. 12, the second photo-resist patterns 124 located at the TFT region 126, the capacitor region 130, and the third region 120 are removed via a second ashing process. The second photo-resist pattern 124 located at the third region 120 is not completely removed because of its greater thickness.

Figure 13:
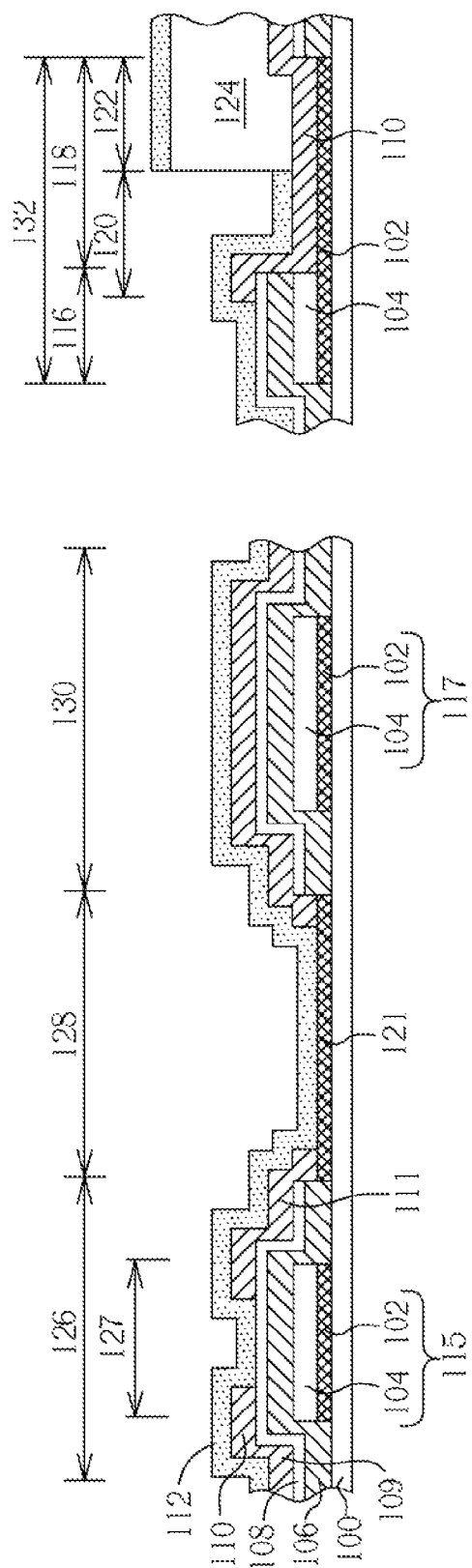

In step S9, referring to FIG. 13, the protecting layer 112 is deposited over or above the substrate 100. The protecting layer 112 may be made of SiOx, SiNy, or SiON.

Figure 14:
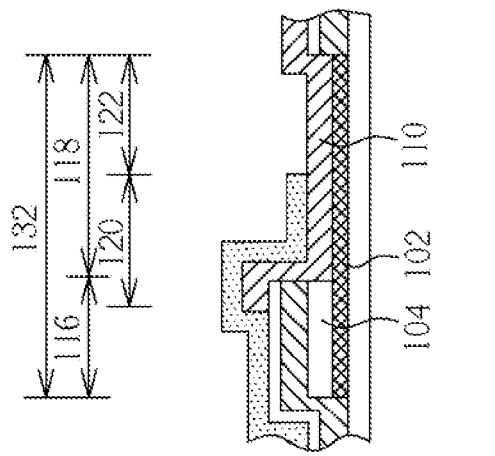
Figure 14:
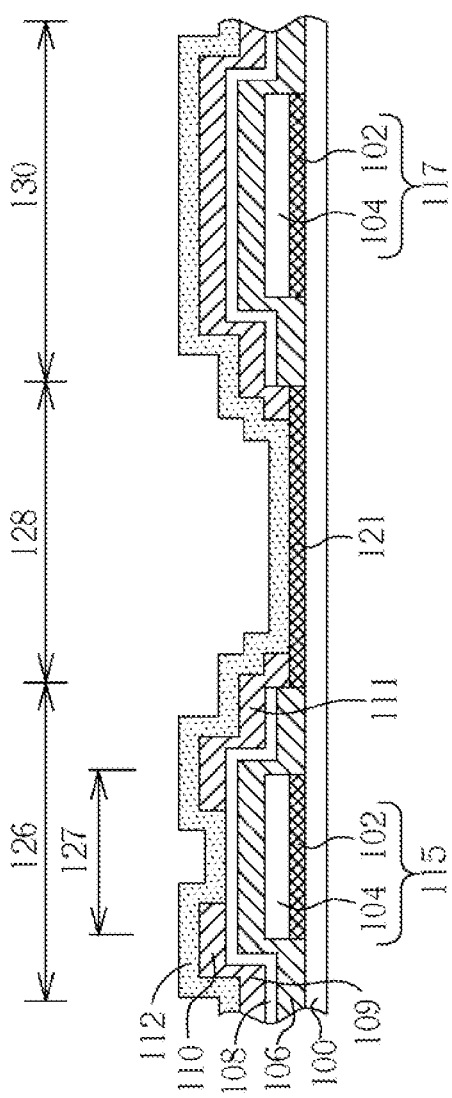

In step S10, referring to FIG. 14, the second photo-resist pattern 124 previously located at the fourth region 122, and the protecting layer 112 formed thereon are removed via a second lift-off process. Thus, the second metal layer 110 located at the fourth region 122 is exposed. The touch pad structure 203 is thus formed by the transparent conductive layer 102, the first metal layer 104, and the second metal layer 110. The touch pad structure 203 can be electrically connected to a driving integrated circuit or a FPC (flexible printed circuit) to a plurality of input or output signals. An alignment layer (not shown) is further formed on the substrate 100.

The LCD panel 200 as shown in FIG. 1 can be fabricated by the method described. In step S5, when depositing the semiconductor layer 108, the operating temperature is not sufficiently high enough to decompose the photo-resist patterns 114, thus IGZO is chosen for the semiconductor layer 108 for its relatively low deposition temperature (usually less than room temperature). In addition, other than the pixel region 128 and the fourth region 122, the entire region of the substrate 100 is covered by the semiconductor layer 108, thus the IGZO is chosen for the semiconductor layer 108 for its transparency and lower photo-leakage current, thus improving the transmittance of the LCD panel.

In summary, only two photo-etching processes are required to fabricate the TFT array 201 of the LCD panel 200, such that a simplified procedure at a reduced cost is provided, and contamination during the fabrication processes can be suppressed.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A method for manufacturing a liquid crystal display (LCD) panel, comprising:
    providing a substrate defining a thin film transistor (TFT) region and a pixel region;
    forming a transparent conductive layer and a first metal layer on the substrate in that order;
    forming a gate line in the TFT region, and a pixel electrode in the pixel region by patterning the transparent conductive layer and the first metal layer via a first photo-etching process;
    forming an insulating layer and a semiconductor layer on the substrate in that order;
    removing the insulating layer and the semiconductor layer from the pixel region;
    removing the first metal layer from the pixel region; forming a second metal layer over the substrate;
    forming a source electrode and a drain electrode in the TFT region by patterning the second metal layer via a second photo-etching process;
    forming a protecting layer over the substrate;
    wherein the TFT region comprises a gate line region, and the first photo-etching process comprises:
    forming a first photo-resist layer on the first metal layer;
    forming a patterned first photo-resist layer on the first metal layer using one or more first photo-resist patterns via a first photolithography process, wherein a thickness of the patterned first photo-resist layer within the pixel region exceeds that of the patterned first photo-resist layer within the gate line region;
    removing the first metal layer and the transparent conductive layer not covered by the patterned first photo-resist layer via a first etching process;
    removing the patterned first photo-resist layer from the gate line region via a first ashing process, and preserving the patterned first photo-resist layer within the pixel region
    wherein the removal of the insulating layer and the semiconductor layer from the pixel region comprises of removing the patterned first photo-resist layer from the pixel region, and the insulating layer and the semiconductor layer formed thereon via a first lift-off process; and
    wherein the substrate further defines a touch pad region comprising a first region and second region, in which the method for manufacturing the LCD panel further comprises forming a touch pad structure.

2. The method of claim 1, wherein during the first photo lithography process, a thickness of the patterned first photo-resist layer within the first region is substantially equal to that of patterned first photo-resist layer within the gate line region; and a thickness of the patterned first photo-resist layer within the second region is substantially equal to that of the patterned first photo-resist layer within the pixel region.

3. The method of claim 1, wherein during the first lift-off process, the patterned first photo-resist layer within the second region, and the insulating layer and the semiconductor layer formed thereon are removed.

4. The method of claim 1, wherein the second photo-etching process comprises:
    defining a third region and a fourth region in the touch pad region, wherein the third region comprises a part of the first region and a part of the second region, the fourth region comprises the remainder of the second region;
    forming a second photo-resist layer on the second metal layer;
    forming a patterned second photo-resist layer on the second metal layer using a second photo-resist pattern via a second photo lithography process, wherein a thickness of the patterned second photo-resist layer within the fourth region exceeds that of the patterned second photo-resist layer within the third region;
    removing the second metal layer not covered by the patterned second photo-resist layer via a second etching process; and
    removing the patterned second photo-resist layer in the third region via a second ashing process, and preserving the patterned second photo-resist layer in the fourth region.

5. The method of claim 4, wherein the second photo-etching process further comprises of removing the patterned second photo-resist layer in the fourth region, and the protecting layer formed thereon via a second lift-off process.

6. The method of claim 4, wherein the second photo-etching process further comprises of defining the drain electrode region and the source electrode in the TFT region, wherein a thickness of the patterned second photo-resist layer within the drain electrode region exceeds that of the patterned second photo-resist layer within the source electrode using the second photo-resist pattern during the second photo lithography process.

7. The method of claim 1, wherein the substrate further defines a capacitor region in which the method further comprises forming a capacitor.

8. The method of claim 7, wherein the first photo-etching process further comprises forming a patterned transparent conductive layer and a patterned first metal layer in the capacitor region in that order.

9. The method of claim 7, wherein the second photo-etching process further comprises forming a patterned second metal layer in the capacitor region.

10. The method of claim 1, wherein the semiconductor layer contains indium gallium zinc oxide.

11. The method of claim 9, wherein the semiconductor layer is formed at room temperature.

12. The method of claim 10, wherein formation of the semiconductor layer is conducted incorporating a gas which includes argon and oxygen, wherein the oxygen is about 5 to 10 percent by volume of the gas.

* * * * *